(12) United States Patent
Field et al.

(10) Patent No.: US 8,130,495 B2
(45) Date of Patent: Mar. 6, 2012

(54) AUDIO AMPLIFIER IN COMPACT CASE WITH PEAK VOLTAGE AND CURRENT LIMITING CIRCUIT AND THERMAL COOLING TUNNEL

(75) Inventors: Andrew L. Field, Davis, CA (US); Scott L. Andres, Gilbert, AZ (US); Jeffrey D. Genzler, Scottsdale, AZ (US)

(73) Assignee: KMC Music, Inc., Bloomfield, CT (US)

( * ) Notice: Subject to any disclaimer, the term of this patent is extended or adjusted under 35 U.S.C. 154(b) by 231 days.

(21) Appl. No.: 12/570,910

(22) Filed: Sep. 30, 2009

(65) Prior Publication Data

US 2011/0075359 A1      Mar. 31, 2011

(51) Int. Cl.
*H05K 7/20* (2006.01)
(52) U.S. Cl. ........................... 361/695; 361/694
(58) Field of Classification Search .............. None
See application file for complete search history.

(56) References Cited

U.S. PATENT DOCUMENTS

| | | | | |
|---|---|---|---|---|
| 5,689,403 | A * | 11/1997 | Robertson et al. | 361/695 |
| 5,726,603 | A * | 3/1998 | Chawla et al. | 330/269 |
| 5,946,188 | A * | 8/1999 | Rochel et al. | 361/690 |
| 6,259,798 | B1 * | 7/2001 | Perkins et al. | 381/397 |
| 6,721,180 | B2 * | 4/2004 | Le et al. | 361/695 |
| 6,731,502 | B1 * | 5/2004 | Hsu | 361/695 |
| 6,853,553 | B2 * | 2/2005 | Seaton et al. | 361/695 |
| 7,039,374 | B2 * | 5/2006 | Hasegawa et al. | 455/128 |
| 2004/0022024 | A1 * | 2/2004 | Le et al. | 361/695 |
| 2004/0036563 | A1 * | 2/2004 | Seaton et al. | 335/202 |
| 2004/0095724 | A1 * | 5/2004 | Hsu | 361/695 |
| 2005/0057899 | A1 * | 3/2005 | Lord | 361/695 |
| 2005/0135068 | A1 * | 6/2005 | Huff | 361/724 |

OTHER PUBLICATIONS

ICEpower Amplifier with integrated ICEpower Supply Datasheet, version 1.1, Bang & Olufsen ICEpower a/s, pp. 1-27, Sep. 30, 2009.
Icepower ASX2 Series, Bang & Olufsen ICEpower a/s, pp. 1-16, Dec. 2008.
Shuttle Max 6.0 Owner's Manual, Genz Benz, Rev. 2, pp. 1-10, Jan. 1, 2009.

\* cited by examiner

*Primary Examiner* — Gregory Thompson
(74) *Attorney, Agent, or Firm* — Robert D. Atkins; Patent Law Group: Atkins & Associates, P.C.

(57) ABSTRACT

An audio sound system has a printed circuit board disposed within a compact case. The PCB has a power conversion circuit for generating an operating potential, audio amplifier circuit coupled for receiving the operating potential to amplify an audio signal, and peak voltage and current limiting circuit coupled to the audio amplifier circuit to avoid hard clipping of the audio signal. The power conversion circuit has heat-generating components. A cooling tunnel is mounted over the printed circuit board. A cooling fan is mounted in the compact case adjacent a first opening of the cooling tunnel for directing air flow through a second opening of the cooling tunnel over the PCB. The cooling tunnel has a notch formed in a side of the cooling tunnel for directing air flow over the PCB. The audio amplifier circuit can generate greater than 500 watts into a 4-ohm load.

33 Claims, 8 Drawing Sheets

AUDIO AMPLIFIER IN COMPACT CASE WITH PEAK VOLTAGE AND CURRENT LIMITING CIRCUIT AND THERMAL COOLING TUNNEL

FIELD OF THE INVENTION

The present invention relates in general to audio sound systems and, more particularly, to an audio amplifier in a compact case with peak voltage and current limiting circuit and thermal cooling tunnel with fan for heat dissipation.

BACKGROUND OF THE INVENTION

Audio amplifiers and speakers for entertainment systems can take a variety of forms. In one case, musical instruments generate electrical audio signals representative of sounds produced by the instrument. Electric guitars and electric bass guitars are well-known musical instruments. The artist plays the guitar and generates electric signals representative of the intended notes and chords. In another case, the audio signals may be generated from vocals through a microphone. The electrical signals are routed through one or more audio amplifiers for pre-amplification, power amplification, filtering, and other signal processing to enhance the tonal quality and properties of the signal. The processed signals then drive one or more speaker systems to reproduce the original sound from the musical instrument for the audience.

Figure 1:
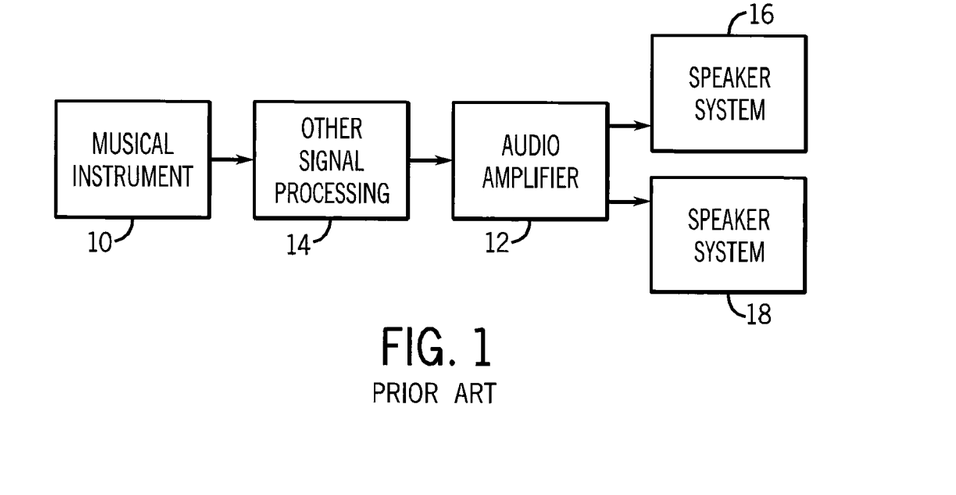
FIG. 1 illustrates a conventional bass guitar connected to an audio sound system.

FIG. 1 illustrates a conventional musical instrument 10, such as an electric bass guitar, providing electrical signals to audio amplifier 12. In one embodiment, audio amplifier 12 can be implemented as ICE Power 250ASX2 audio power amplifier. Other signal processing units 14, such as pre-amplifier or effects loop, can be placed between musical instrument 10 and audio amplifier circuit 12. Audio amplifier 12 has separate outputs to drive one or two speaker systems 16 and 18, such as passive or active speakers, subwoofers, wireless speakers, multimedia audio, and distributed audio. Audio amplifier 12 is typically housed in a compact, small profile case having dimensions of 6.4×25.4×26.7 centimeters (cm) and weight of about 1.7 kilograms. Audio amplifier 12 can produce 250 watts (W) into two 4-ohm loads for stereo applications, or 500 W into a single 8-ohm load using a bridge tied load (BTL) for mono applications. Amplifier is specified for convection cooled operation, and the amplifier is not rated for 2 ohm stereo or 4 ohms BTL operation.

Musicians often demand additional power depending on the type of music being played. Although more power can be generated by physically larger units, the competitive market prefers the compact case due to its light weight and convenience of handling. Yet, an attempt to generate more power from the compact case tends to increase heat dissipation and operating currents. The compact case cannot properly dissipate the heat generated by higher power ratings of 2 ohm stereo or 4 ohm BTL operation. The tradeoff between power, thermal management, and size of the amplifier case has limited conventional audio amplifiers to the specifications described above.

SUMMARY OF THE INVENTION

A need exists to generate more power from an audio amplifier in a compact, small profile case. Accordingly, in one embodiment, the present invention is an audio sound system comprising a compact case having dimensions of approximately 6.4 by 25.4 by 26.7 centimeters. A printed circuit board is disposed within the compact case. The printed circuit board includes a power conversion circuit for generating an operating potential. The power conversion circuit includes heat-generating components. The printed circuit board further includes an audio amplifier circuit coupled for receiving the operating potential to amplify an audio signal, and peak voltage and current limiting circuit coupled to the audio amplifier circuit to avoid hard clipping of the audio signal. A cooling tunnel is mounted over the printed circuit board. A cooling fan is mounted in the compact case adjacent a first opening of the cooling tunnel for directing air flow through a second opening of the cooling tunnel over the heat-generating components.

In another embodiment, the present invention is an audio sound system comprising a compact case and printed circuit board disposed within the compact case. The printed circuit board includes a power conversion circuit for generating an operating potential, an audio amplifier circuit coupled for receiving the operating potential to amplify an audio signal, and peak voltage and current limiting circuit coupled to the audio amplifier circuit. A cooling tunnel is mounted over the printed circuit board for directing air flow through a first opening of the cooling tunnel over the printed circuit board.

In another embodiment, the present invention is an audio sound system comprising a compact case and printed circuit board disposed within the compact case for amplifying an audio signal. A cooling tunnel is mounted over the printed circuit board for directing air flow through a first opening of the cooling tunnel over the printed circuit board.

In another embodiment, the present invention is a method of amplifying an audio signal comprising the steps of providing a compact case, disposing a printed circuit board within the compact case. The printed circuit board includes a power conversion circuit for generating an operating potential, audio amplifier circuit coupled for receiving the operating potential to amplify an audio signal, and peak voltage and current limiting circuit coupled to the audio amplifier circuit. The method further includes the step of mounting a cooling tunnel over the printed circuit board for directing air flow through a first opening of the cooling tunnel over the printed circuit board.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 2:
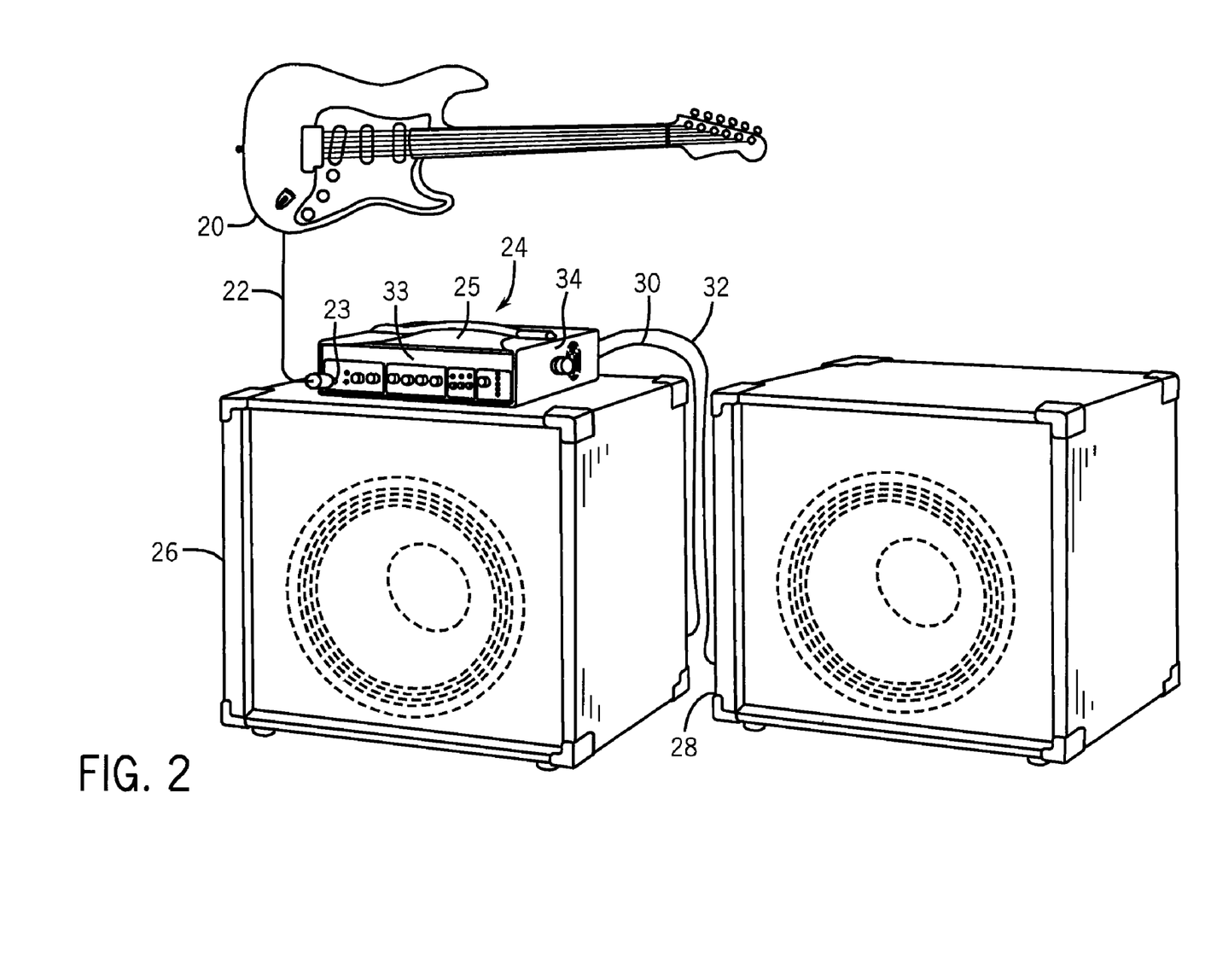
FIG. 2 illustrates a bass guitar connected to an audio sound system.

Referring to FIG. 2, a musical instrument 20, such as an electric bass guitar, is shown with an audio output cable 22. In other embodiments, the musical instrument may be an electric guitar, violin, drums, electric keyboard, audio microphone, or other instrument generating electric signals representative of sound content. Guitar 20 generates an electric signal representative of the produced sounds, which is routed via audio output cable 22 to front panel input jack 23 of audio amplifier 24 for signal processing and power amplification. The signal processing may include amplification, equalization, filtering, special effects, and other signal processing functions. The output of audio amplifier 24 connects to speaker systems 26 and 28 through cables 30 and 32, respectively. The power amplification increases the power level and signal strength of the audio signal (voltage and current) to drive speaker systems 26 and 28 and reproduce the original sound from the musical instrument.

Audio amplifier 24 is contained within a compact, small profile case 25 having dimensions of 6.4×25.4×26.7 cm and weight of about 1.7 kilograms. Audio amplifier 24 has a front user control panel interface 33. Audio amplifier 24 fits into enclosure 34 attached to a top surface of speaker 26. The compact dimensions and light weight of audio amplifier 24 make it ideal for handling and transporting, while compact case 25 conveniently fits into enclosure 34 during a playing session.

Figure 3:
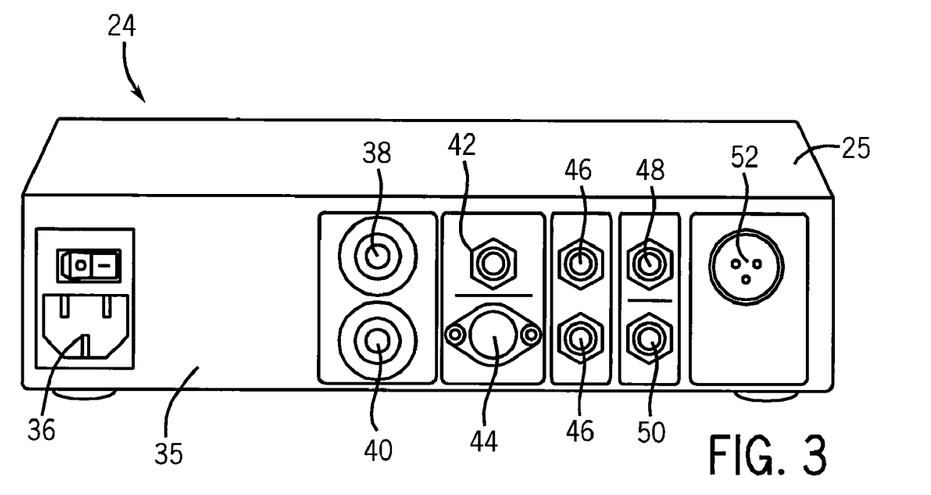
FIG. 3 illustrates a back view of a compact case with various input and output jacks.

FIG. 3 shows a back panel 35 of compact case 25 with a variety of input and output jacks. Alternating current (AC) power is connected to electrical terminal 36. Speaker cables 30 and 32 plug into jacks 38 and 40. Headphones can plug into jack 42. A foot control switch can plug into jack 44. An effects loop send and receive is provided through jacks 46. The effects loop can bring in additional signal processing features, such as compressor, echo, reverb, and distortion. Jack 48 is auxiliary input, jack 50 is tuner out, and jack 52 is direct output.

Figure 4:
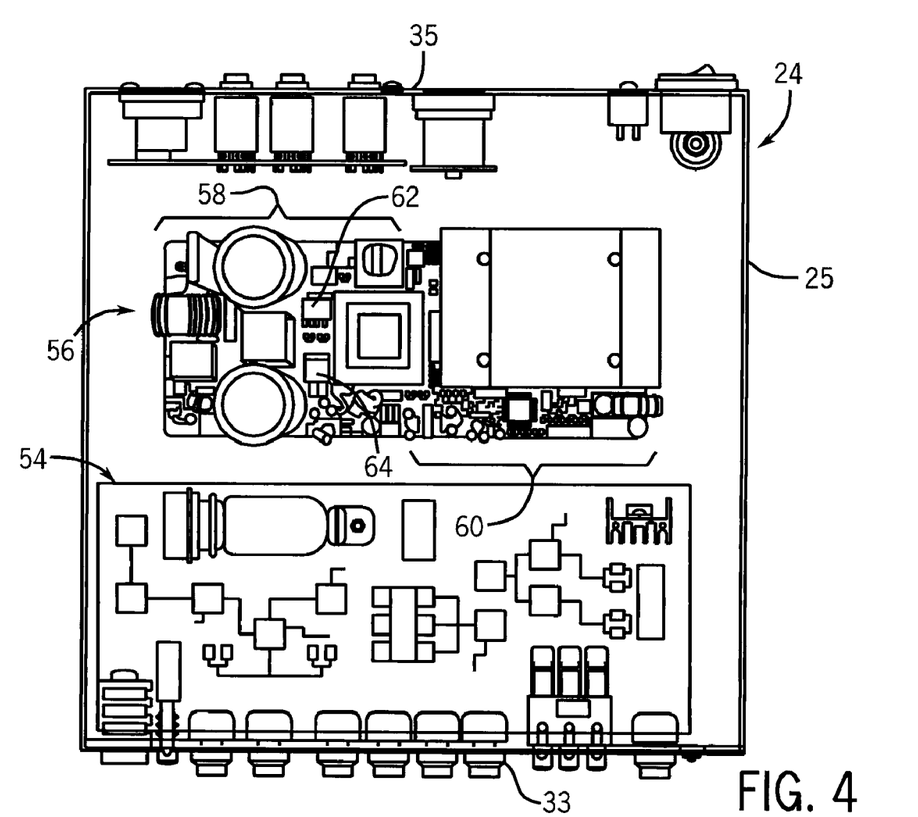
FIG. 4 illustrates an interior view of the compact case.

FIG. 4 is an interior view of compact case 25 containing printed circuit board (PCB) 54 and PCB 56. PCB 54 contains electrical components for interfacing to front user control panel 33, amplification, and other signal processing. PCB 56 performs AC/DC power conversion in area 58, and output stage class D amplification in area 60. The AC/DC power conversion utilizes pulse width modulation with power switching metal oxide semiconductor field effect transistors (MOSFET) 62 and 64. As will be seen, power MOSFETs 62 and 64 are major heat-generating devices requiring specialized thermal management for heat dissipation.

Figure 5:
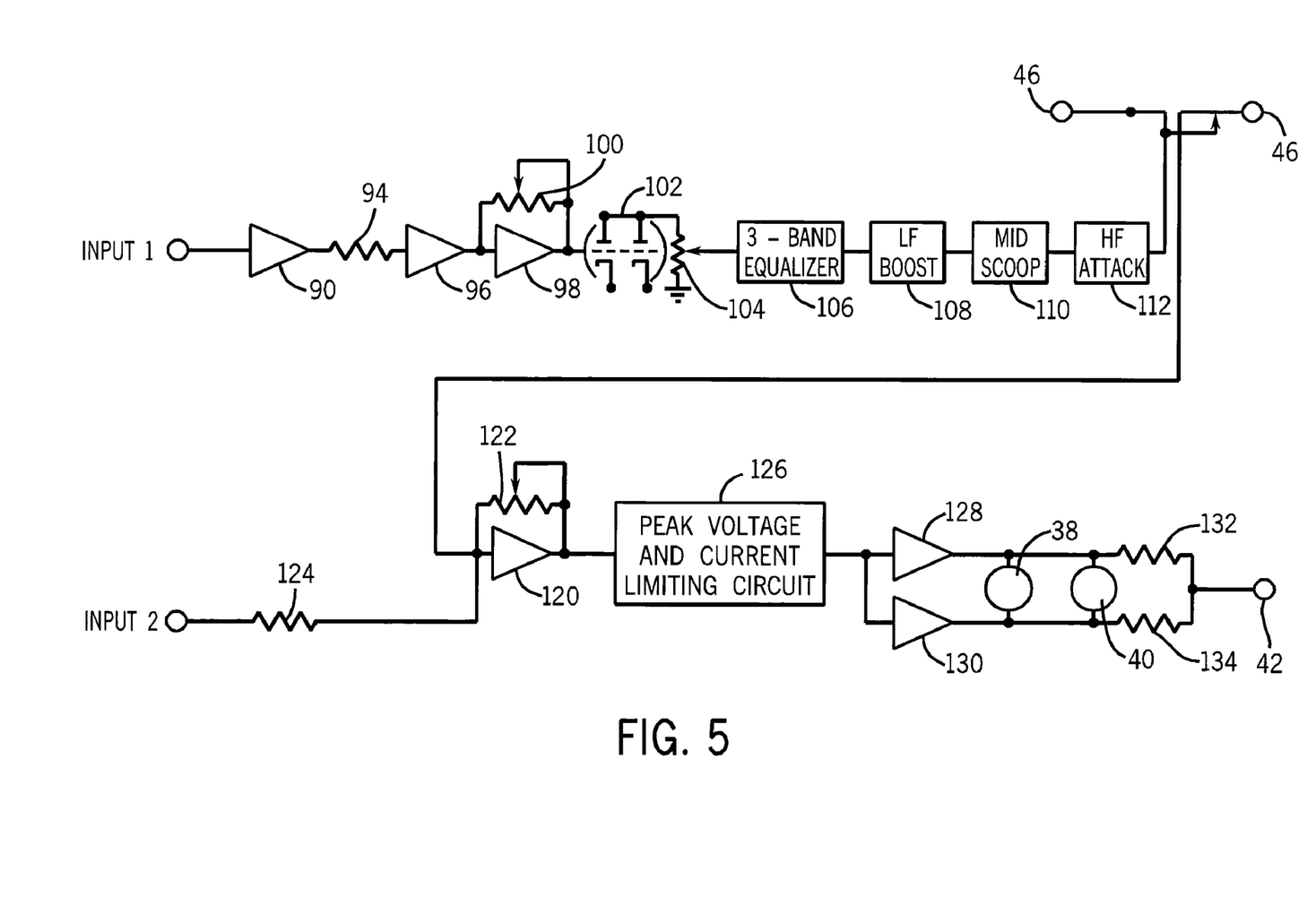
FIG. 5 is a schematic and block diagram of the signal processing of the audio amplifier.

FIG. 5 is a schematic and block diagram of PCBs 54 and 56. INPUT1 corresponds to front panel input jack 23 and INPUT2 can be auxiliary input jack 48. The electrical signal from guitar 20 is routed through cable 22 and INPUT1 to an input of buffer 90 with gain of about 1.5. The output of buffer 90 is coupled through resistor 94 to high-pass filter 96. Amplifier 98 and variable resistor 100 provide gain control for vacuum tube type amplifiers 102. Amplifier 98 has the ability to overdrive vacuum tube amplifier 102 to create distortion, which is desired by many bass guitar musicians. Variable resistor 104 adjusts the output signal level of vacuum tube amplifier 102. Block 106 is a 3-band equalizer with low frequency, sweepable mid frequency, and high frequency adjustment. Filter 108 is a low frequency boost, filter 110 is mid frequency scoop, and filter 112 is high frequency attack for filtering and waveform shaping. Terminals 46 provide for an optional effects loop, as described in FIG. 3. A summing amplifier 120 and variable resistor 122 provide master volume control. INPUT2 can be auxiliary input 48 connected to CD player, MP3 player, or other audio source for additional sounds, which is summed into the master volume control through resistor 124. Block 126 is a peak voltage and current limiting circuit for limiting the output signal of amplifier 120 to prevent hard clipping output stage power amplifiers 128 and 130 to a square wave. Power amplifiers 128 and 130 are shown bridged to speaker jacks 38 and 40. Alternatively, speaker jacks 38 and 40 can be driven separately by power amplifiers 128 and 130. Power amplifiers 128 and 130 also connect through resistors 132 and 134 to headphone jack 42. Volume control amplifier 120, output stage power amplifiers 128 and 130, and other electronic components on PCBs 54 and 56 receive operating potentials $\pm V_{CC}$ for amplifying the power level and signal strength of the respective input signal.

Figure 6:
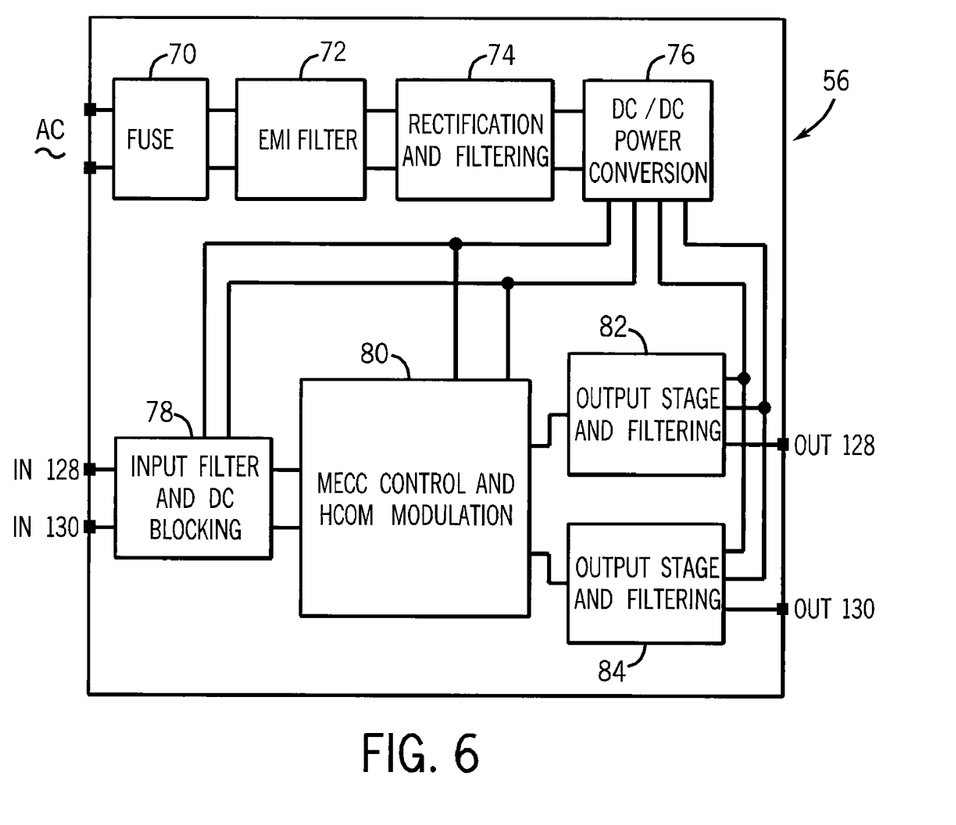
FIG. 6 is a block diagram of power conversion and output stage amplifier circuit.

FIG. 6 is a block diagram of output stage power amplifier circuit 128-130, as well as the power conversion circuit for PCB 54 and 56. AC power is routed through fuse 70 to electromagnetic interference (EMI) filter 72 and rectification and filtering block 74 to convert the AC power to direct current (DC) power. DC/DC power conversion block 76 provides regulated and unregulated DC operating potentials ($V_{CC}$), e.g., ±5, ±24, and ±65 volts DC, to the electrical components in PCB 56. DC/DC power conversion block 76 contains the heat-generating power MOSFETs 62 and 64. Block 78 receives input signals from IN128 and IN130 from peak voltage and current limiting circuit 126 and provides input buffering and filtering and DC blocking. Block 80 performs multivariable enhanced cascade control (MECC) and hybrid controlled oscillation modulation (HCOM). Blocks 82 and 84 are power output stages and filtering for OUT128 and OUT130 to speaker jacks 38 and 40, respectively. The audio amplifier circuit 78-84 receives the $V_{CC}$ operating potentials from DC/DC power conversion block 76 to increase the power level and signal strength of the audio signal to drive speaker systems 26 and 28.

Musicians often demand additional power depending on the type of music being played. For example, bass guitar musicians may want greater than 500 W, up to 1000 W, into 4-ohm speaker loads to play accentuated or aggressive notes and chords. To achieve the higher power demands, audio amplifier circuit 78-84 requires more operating power from DC/DC power conversion block 76. Accordingly, power switching MOSFETs 62 and 64 in DC/DC power conversion block 76, as well as output stage and filtering blocks 82 and 84, generate more heat with the additional power demand which must be properly and adequately dissipated in compact case 25.

Figure 7:
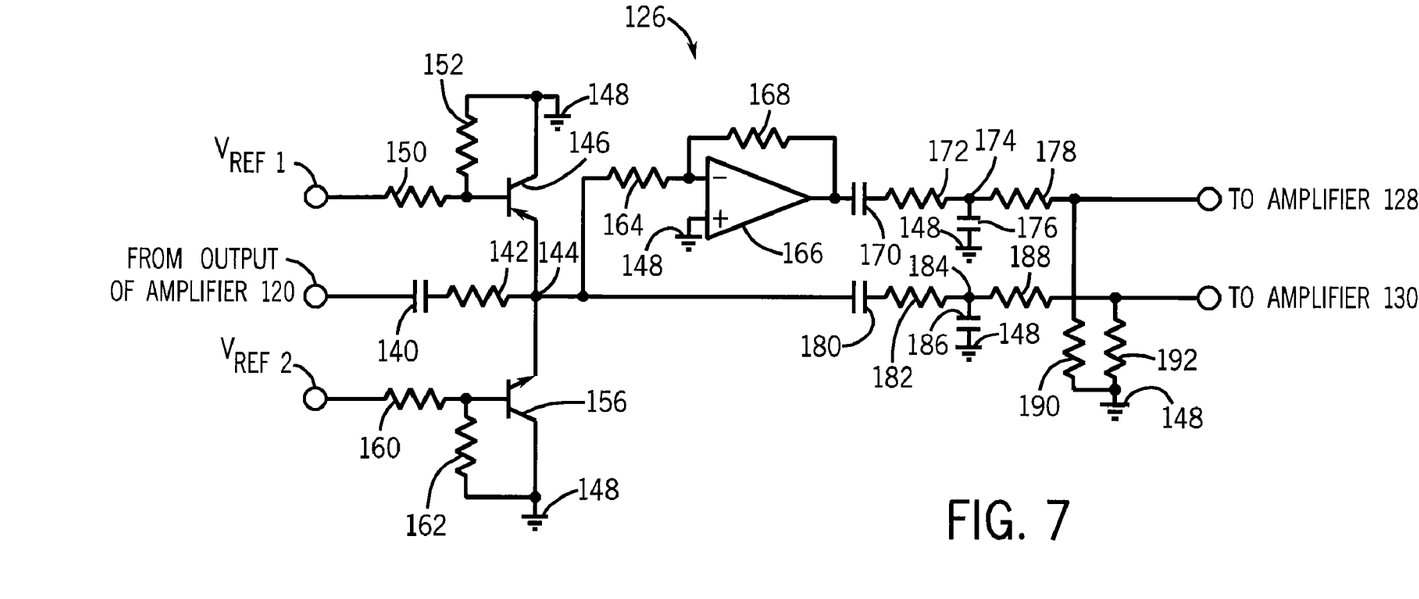
FIG. 7 illustrates further detail of the peak voltage and current limiting circuit.

FIG. 7 shows further detail of peak voltage and current limiting circuit 126. Peak voltage and current limiting circuit 126 prevents output stage power amplifiers 128 and 130 from hard clipping to a square wave, for example, when playing an accentuated or aggressive note from bass guitar 20. Peak voltage and current limiting circuit 126 maintains controlled operation of output stage power amplifiers 128-130 during all playing levels. The output of amplifier 120 is coupled through capacitor 140 and resistor 142 to node 144. Transistor 146 has an emitter coupled to node 144, collector coupled to power supply conductor 148 operating at ground potential, and base coupled through resistor 150 to $V_{REF1}$ operating at $+V_{CC}$. The base of transistor 146 is also coupled through resistor 152 to power supply conductor 148. Transistor 156 has an emitter coupled to node 144, collector coupled to power supply conductor 148, and base coupled through resistor 160 to $V_{REF2}$ operating at $-V_{CC}$. The base of transistor 156 is also coupled through resistor 162 to power supply conductor 148. Transistors 146 and 156 limit the output signal of volume control amplifier 120 prior to hard clipping output stage power amplifiers 128-130 to a square wave. In other words, transistors 146 and 156 are set to limit or pre-soft clip the output signal of amplifier 120 right before the internal hard clip of output stage power amplifiers 128-130.

Peak voltage and current limiting circuit 126 further includes resistor 164 coupled between node 144 and the inverting input of amplifier 166. The non-inverting input of amplifier 166 is coupled to power supply conductor 148. Resistor 168 is coupled between the output of amplifier 166 and the inverting input of amplifier 166. The output of amplifier 166 is also coupled through series-connected capacitor 170 and resistor 172 to node 174. Capacitor 176 is coupled between node 174 and power supply conductor 148. Resistor 178 is coupled between node 174 and the input of amplifier 128. Capacitor 180 and resistor 182 are serially coupled between node 144 and node 184. Capacitor 186 is coupled between node 184 and power supply conductor 148. Resistor 188 is coupled between node 184 and the input of amplifier 130. Resistor 190 is coupled between the input of amplifier 128 and power supply conductor 148, and resistor 192 is coupled between the input of amplifier 130 and power supply conductor 148.

Figure 8:
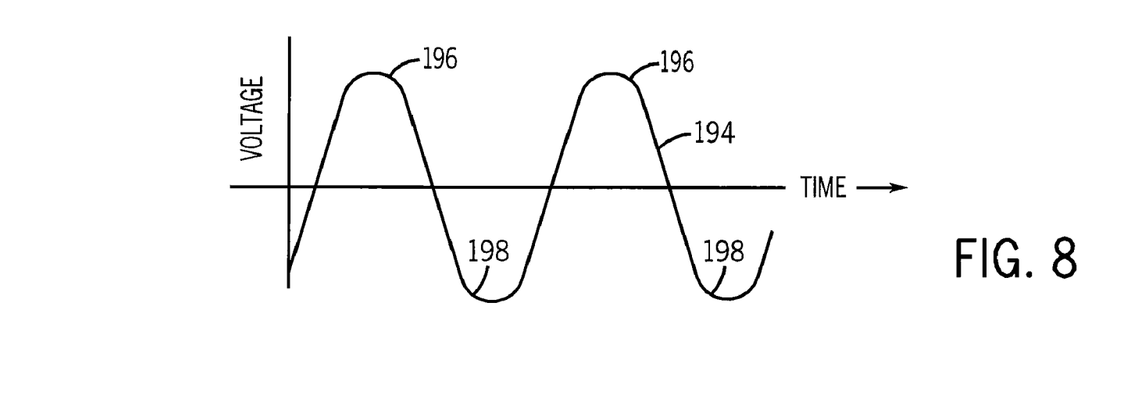
FIG. 8 illustrates a waveform plot of the peak voltage and current limited output of the volume control amplifier.

FIG. 8 illustrates waveform 194 at node 144. A similar waveform exists at the outputs of power amplifiers 128 and 130. Notice peaks 196 and valleys 198 are limited and tend to flatten, maintaining radiused corner transitions, but do not hard clip to a square wave. Peak voltage and current limiting circuit 126 aids in the desired goal achieving greater than 500 W, up to 1000 W, into 4-ohm speaker load by preventing hard clipping on output stage power amplifiers 128-130. Peak voltage and current limiting circuit 126 maintains controlled operation of amplifier 120 and output stage power amplifiers 128-130 during all playing levels.

In addition, to achieve greater than 500 W, up to 1000 W, into 4-ohm power capability for audio amplifier 24, DC/DC power conversion block 76 must provide additional power to output stage amplifiers 128 and 130. The additional power demand on DC/DC power conversion block 76 increases the current through power MOSFETs 62 and 64 as used to switch transformer currents in the pulse width modulated power conversion process. The heat generated by power switching MOSFETs 62 and 64 must be properly dissipated within the space limitations of compact case 25. The additional currents must also be controlled/limited within blocks 74, 76, 82 and 84.

Figure 9A:
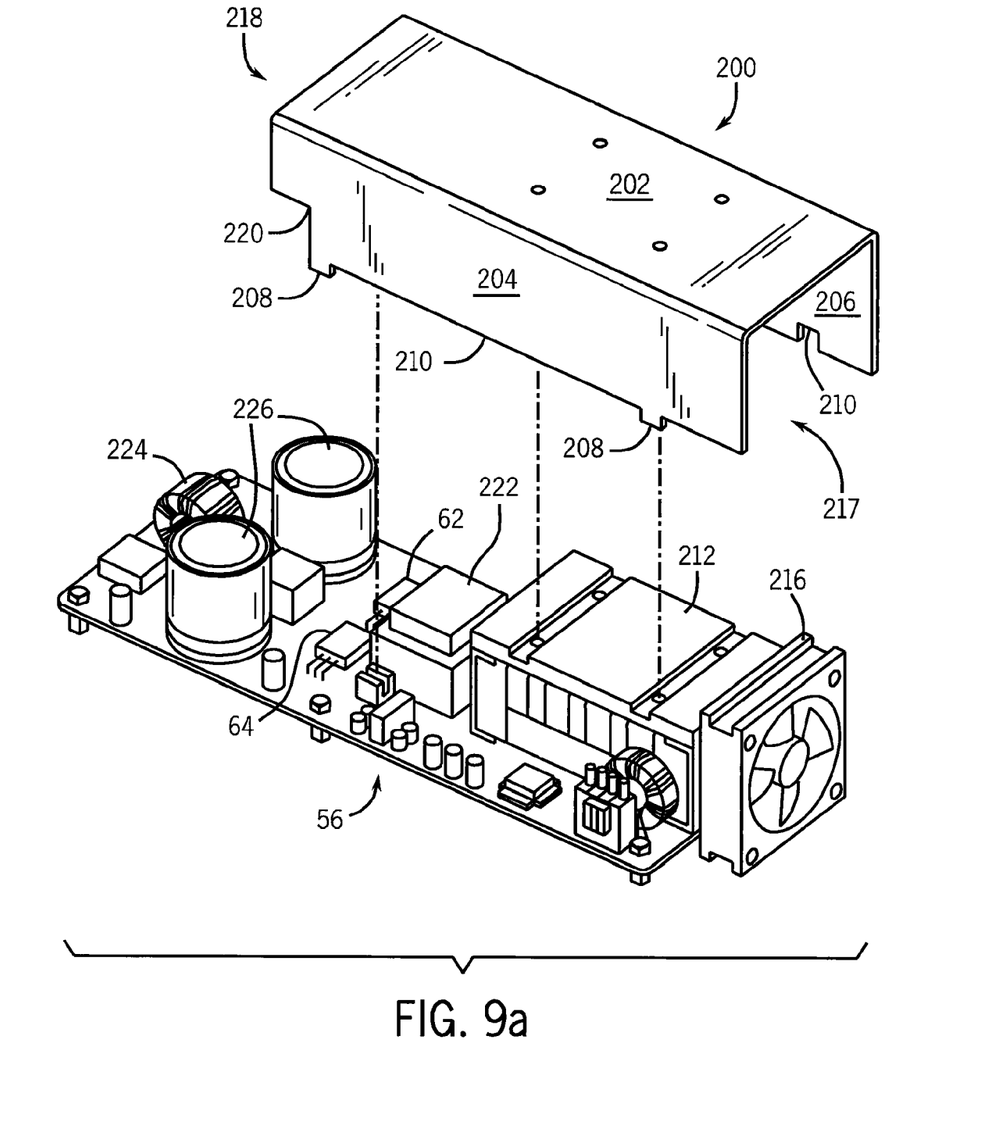
FIGS. 9a-9c illustrate various views of a cooling tunnel for the power conversion and signal processing PCB.
Figures 9B, 9C:
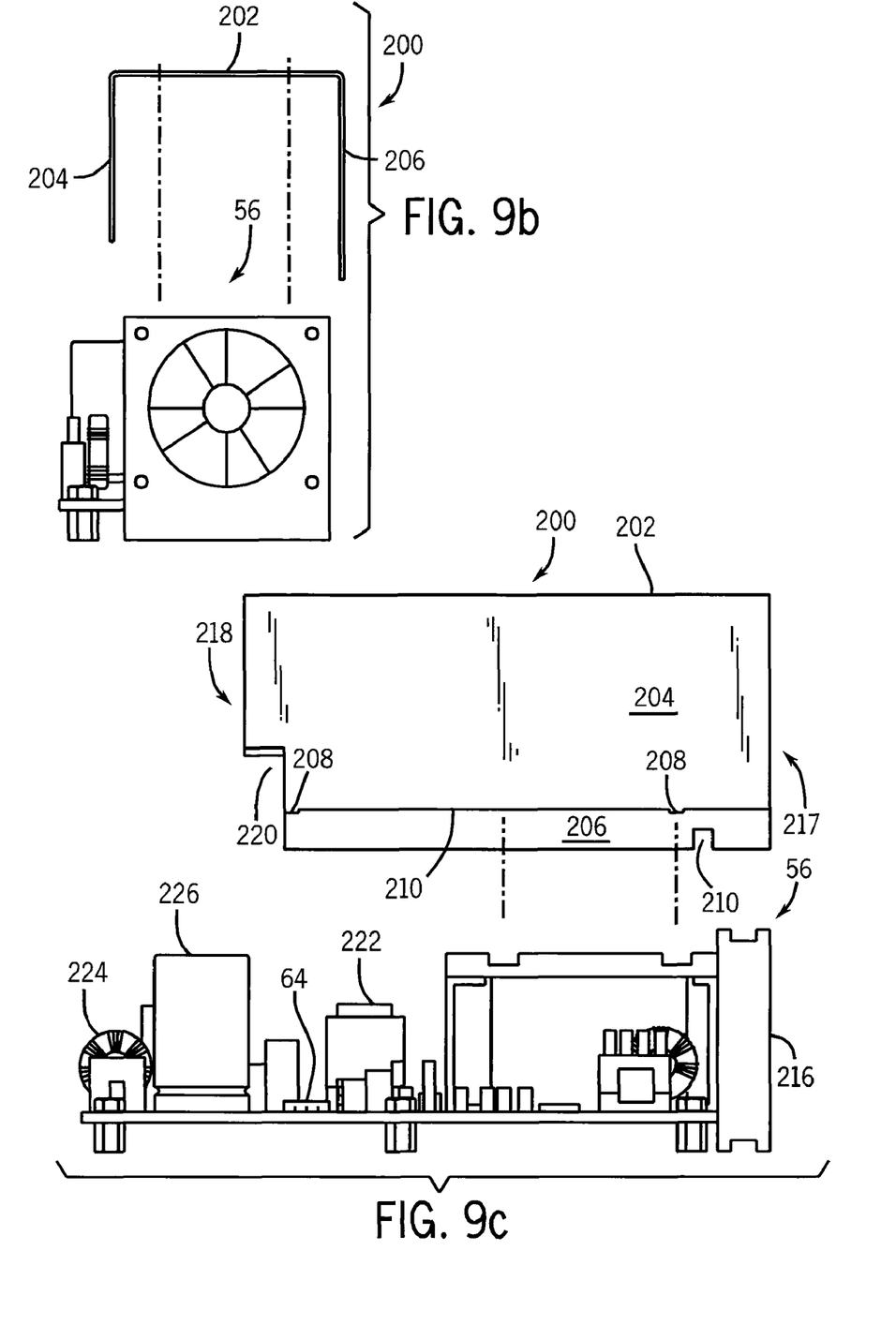

FIG. 9a shows a prospective view of cooling tunnel 200 mounted over PCB 56 for heat dissipation. More specifically, cooling tunnel 200 channels air flow over major heat-generating electrical components, including power MOSFETs 62 and 64. Cooling tunnel 200 has a top surface 202 and side surfaces 204 and 206. Heat sink 212 also provides for electrical components on PCB 56. FIG. 9b is an end view showing that side surface 204 is shorter than side surface 206. Side surface 206 extends down to bottom chassis 214 of compact case 25 for a stable support base. Cooling tunnel 200 readily fits over and directs balanced air flow across the heat-critical electrical components of PCB 56. FIG. 9c shows a side view of cooling tunnel 200. Feet 208 guide placement of cooling tunnel 200 to PCB 56. One or more notches like 210 can be formed or cut into side surfaces 204 and 206 of cooling tunnel 200 to create space between the side surfaces and electrical components of PCB 56. Notch 210 prevents side surfaces 204 and 206 from contacting or damaging the electrical components of PCB 56.

Figure 10:
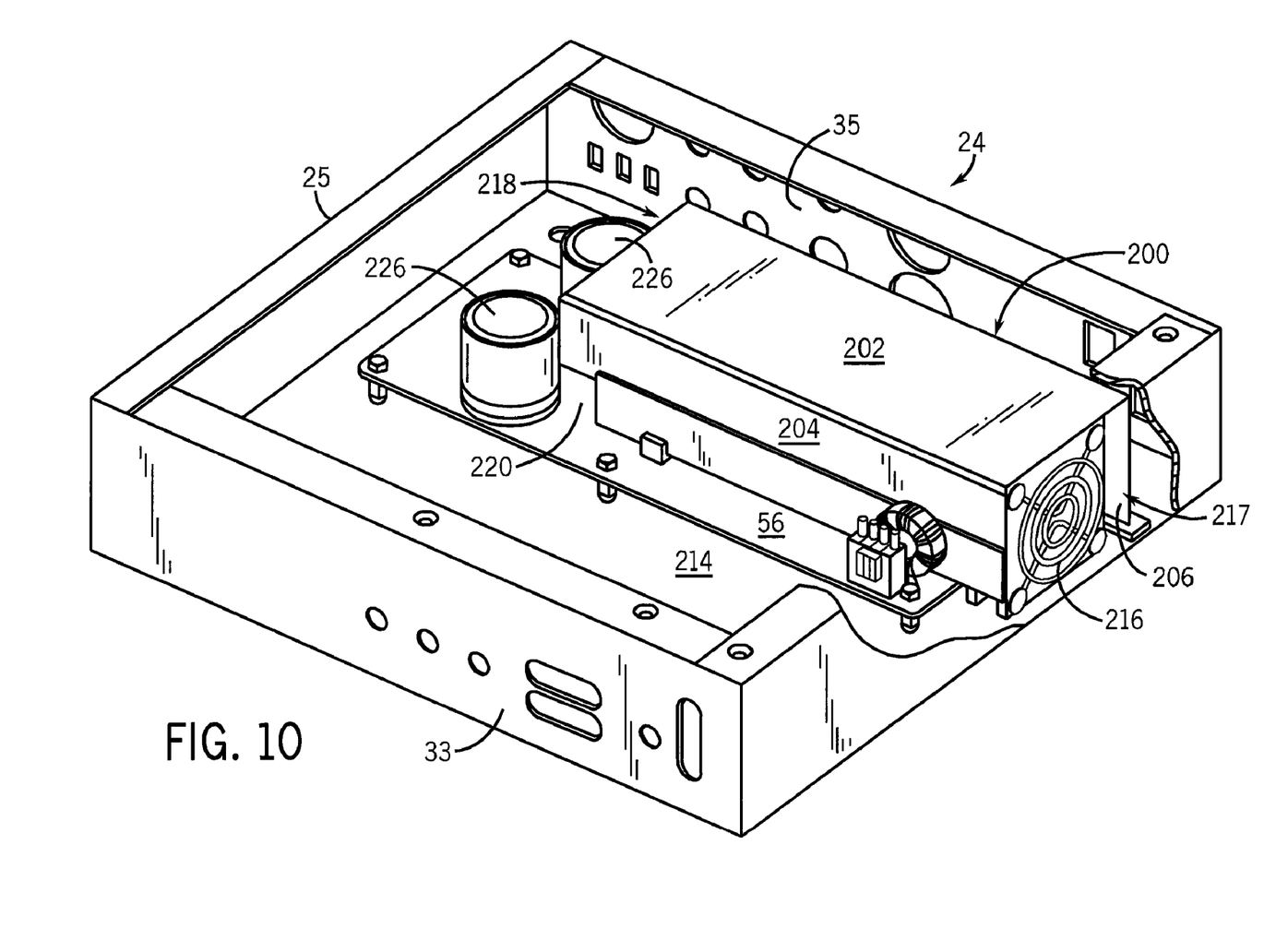
FIG. 10 illustrates the cooling tunnel and PCB installed in the compact case.

FIG. 10 shows PCB 56 and cooling tunnel 200 installed in compact case 25 of audio amplifier 24. Cooling fan 216 is disposed in compact case 25 adjacent to opening 217 of cooling tunnel 200 to draw air out of the compact case. Cooling fan 216 can also be placed on top surface 202. Fresh air is drawn in through opening 218 and through notches 220 of cooling tunnel 200 and flows across the electrical components of PCB 56. The heated air is then exhausted out opening 217 by cooling fan 216. The major heat-generating components, e.g., transformer 222, coils 224, electrolytic capacitors 226, power MOSFETs 62-64, rectifier blocks 74, 76, and output stage blocks 82, 84 are located on PCB 56 near opening 218 or inside cooling tunnel 200. The air flow drawn into cooling tunnel 200 through opening 218 provide maximum heat dissipation and maintain a proportional thermal range for each electrical component within its thermal design parameters. The opening 218 maintains a balanced air flow across the electrical components of PCB 56. Notch 220 directs targeted air flow across power MOSFETs 62 and 64 and other major heat-generating electrical components. The deeper side 206 also aids with maximum air flow efficiency from cooling fan 216. A thermo-couple can be attached to a component of PCB 56 to regulate speed of cooling fan 216 and the volume of air flow through cooling tunnel 200.

In summary, the audio amplifier circuit can generate a high power rating greater than 500 W, up to 1000 W, into 4-ohm speaker load, in a compact case. The higher power rating is achieved by limiting peak voltage and current in the output stage amplifiers to prevent hard clipping to a square wave. The peak voltage and current limiting circuit maintains controlled operation of the power amplifiers and power conversion circuit during all playing levels. The additional power from the DC/DC power converter generates more heat which is dissipated with a cooling tunnel that channels maximum air flow over the major heat-generating electrical components, including the power switching transistors in the DC/DC converter. The cooling tunnel provides the necessary thermal management within the space limitations of the compact case.

While one or more embodiments of the present invention have been illustrated in detail, the skilled artisan will appreciate that modifications and adaptations to those embodiments may be made without departing from the scope of the present invention as set forth in the following claims.

What is claimed is:

1. An audio sound system, comprising:
   a compact case having dimensions of approximately 6.4 by 25.4 by 26.7 centimeters;
   a printed circuit board (PCB) disposed within the compact case, the PCB including,
   (a) a power conversion circuit for generating an operating potential, the power conversion circuit including heat-generating components,
   (b) an audio amplifier circuit coupled for receiving the operating potential to amplify an audio signal, and
   (c) a peak voltage and current limiting circuit coupled to the audio amplifier circuit to avoid hard clipping of the audio signal;
   a cooling tunnel mounted over the PCB for directing air flow across the heat-generating components, the cooling tunnel including a top surface, first side surface integrated with the top surface and having a first height extending from the top surface to the PCB, and second side surface integrated with the top surface and having a second height less than the first height of the first side surface; and a cooling fan mounted in the compact case adjacent a first opening of the cooling tunnel for directing air flow through a second opening of the cooling tunnel over the heat-generating components.

2. The audio sound system of claim 1, wherein the heat-generating components include a power switching metal oxide semiconductor field effect transistor operating within the power conversion circuit.

3. The audio sound system of claim 1, wherein the peak voltage and current limiting circuit includes:

a first transistor having a first conduction terminal coupled to the audio amplifier circuit, second conduction terminal coupled to a power supply conductor, and control terminal coupled for receiving a first reference potential; and a second transistor having a first conduction terminal coupled to the audio amplifier circuit, second conduction terminal coupled to the power supply conductor, and control terminal coupled for receiving a second reference potential.

4. The audio sound system of claim 1, wherein the cooling tunnel includes a notch formed in the second side surface of the cooling tunnel for directing air flow over the heat-generating components.

5. The audio sound system of claim 1, wherein the audio amplifier circuit generates greater than 500 watts into a 4-ohm load.

6. The audio sound system of claim 1, wherein the cooling tunnel includes a notch formed in the second side surface of the cooling tunnel to create space between the second side surface of the cooling tunnel and electrical components on the printed circuit board.

7. An audio sound system, comprising:

a compact case;

a printed circuit board disposed within the compact case, the printed circuit board including,
(a) a power conversion circuit for generating an operating potential,
(b) an audio amplifier circuit coupled for receiving the operating potential to amplify an audio signal, and
(c) a peak limiting circuit coupled to the audio amplifier circuit; and a cooling tunnel mounted over the printed circuit board for directing air flow through a single opening of the cooling tunnel over a majority of the power conversion circuit.

8. The audio sound system of claim 7, further including a cooling fan mounted in the compact case adjacent a second opening of the cooling tunnel for directing the air flow through the single opening of the cooling tunnel over the power conversion circuit.

9. The audio sound system of claim 7, wherein the compact case has dimensions of approximately 6.4 by 25.4 by 26.7 centimeters.

10. The audio sound system of claim 7, wherein the peak limiting circuit includes:

a first transistor having a first conduction terminal coupled to the audio amplifier circuit, second conduction terminal coupled to a power supply conductor, and control terminal coupled for receiving a first reference potential; and a second transistor having a first conduction terminal coupled to the audio amplifier circuit, second conduction terminal coupled to the power supply conductor, and control terminal coupled for receiving a second reference potential.

11. The audio sound system of claim 7, wherein the cooling tunnel includes a notch formed in a side of the cooling tunnel for directing air flow over the power conversion circuit.

12. The audio sound system of claim 7, wherein the audio amplifier circuit generates greater than 500 watts into a 4-ohm load.

13. The audio sound system of claim 7, wherein the cooling tunnel includes a notch formed in a side of the cooling tunnel to create space between the side of the cooling tunnel and electrical components on the printed circuit board.

14. An audio sound system, comprising:

a compact case;

a printed circuit board disposed within the compact case for amplifying an audio signal, the printed circuit board including heat-generating components; and a cooling tunnel mounted over the printed circuit board for directing air flow through a single opening of the cooling tunnel over a majority of the heat-generating components, the cooling tunnel including a top surface and first and second side surfaces integrated with the top surface and extending along an entire length of the cooling tunnel from the top surface to the printed circuit board.

15. The audio sound system of claim 14, wherein the printed circuit board includes:

a power conversion circuit for generating an operating potential;

an audio amplifier circuit coupled for receiving the operating potential to amplify the audio signal; and a peak limiting circuit coupled to the audio amplifier circuit.

16. The audio sound system of claim 15, wherein the audio amplifier circuit generates greater than 500 watts into a 4-ohm load.

17. The audio sound system of claim 15, wherein the peak limiting circuit includes:

a first transistor having a first conduction terminal coupled to the audio amplifier circuit, second conduction terminal coupled to a power supply conductor, and control terminal coupled for receiving a first reference potential; and a second transistor having a first conduction terminal coupled to the audio amplifier circuit, second conduction terminal coupled to the power supply conductor, and control terminal coupled for receiving a second reference potential.

18. The audio sound system of claim 14, further including a cooling fan mounted in the compact case adjacent a second opening of the cooling tunnel for directing the air flow through the single opening of the cooling tunnel over the heat-generating components.

19. The audio sound system of claim 14, wherein the compact case has dimensions of approximately 6.4 by 25.4 by 26.7 centimeters.

20. The audio sound system of claim 14, wherein the cooling tunnel includes a notch formed in the second side surface of the cooling tunnel for directing air flow over the heat-generating components.

21. A method of amplifying an audio signal, comprising:

providing a compact case;

disposing a printed circuit board within the compact case by,
(a) providing a power conversion circuit for generating an operating potential, (b) providing an audio amplifier circuit coupled for receiving the operating potential to amplify an audio signal, and (c) providing a peak limiting circuit coupled to the audio amplifier circuit; and mounting a cooling tunnel over the printed circuit board for directing air flow through a first opening of the cooling tunnel over the power conversion circuit, the cooling tunnel including a top surface and first and second side surfaces integrated with the top surface and extending along the cooling tunnel from the top surface to the printed circuit board.

22. The method of claim 21, further including mounting a cooling fan in the compact case adjacent a second opening of the cooling tunnel for directing the air flow through the first opening of the cooling tunnel over the power conversion circuit.

23. The method of claim 21, wherein the compact case has dimensions of approximately 6.4 by 25.4 by 26.7 centimeters.

24. The method of claim 21, further including forming a notch in a side the second side surface of the cooling tunnel for directing air flow over the power conversion circuit.

25. The method of claim 21, wherein the audio amplifier circuit generates greater than 500 watts into a 4-ohm load.

26. An audio sound system, comprising:
a compact case;
a printed circuit board disposed within the compact case for amplifying an audio signal, the printed circuit board including heat-generating components; and
a cooling tunnel mounted over the printed circuit board for directing air flow through a single opening of the cooling tunnel over a majority of the heat-generating components.

27. The audio sound system of claim 26, wherein the cooling tunnel including a top surface and first and second side surfaces integrated with the top surface and extending along the cooling tunnel from the top surface to the printed circuit board.

28. The audio sound system of claim 26, wherein the printed circuit board includes:
a power conversion circuit for generating an operating potential;
an audio amplifier circuit coupled for receiving the operating potential to amplify the audio signal; and
a peak limiting circuit coupled to the audio amplifier circuit.

29. The audio sound system of claim 28, wherein the peak limiting circuit includes:
a first transistor having a first conduction terminal coupled to the audio amplifier circuit, second conduction terminal coupled to a power supply conductor, and control terminal coupled for receiving a first reference potential; and
a second transistor having a first conduction terminal coupled to the audio amplifier circuit, second conduction terminal coupled to the power supply conductor, and control terminal coupled for receiving a second reference potential.

30. The audio sound system of claim 28, wherein the audio amplifier circuit generates greater than 500 watts into a 4-ohm load.

31. The audio sound system of claim 26, further including a cooling fan mounted in the compact case adjacent a second opening of the cooling tunnel for directing the air flow through the single opening of the cooling tunnel over the heat-generating components.

32. The audio sound system of claim 26, wherein the compact case has dimensions of approximately 6.4 by 25.4 by 26.7 centimeters.

33. The audio sound system of claim 26, wherein the cooling tunnel includes a notch formed in a side of the cooling tunnel for directing air flow over the heat-generating components.

* * * * *

UNITED STATES PATENT AND TRADEMARK OFFICE
CERTIFICATE OF CORRECTION

PATENT NO. : 8,130,495 B2  Page 1 of 1
APPLICATION NO. : 12/570910
DATED : March 6, 2012
INVENTOR(S) : Andrew L. Field et al.

It is certified that error appears in the above-identified patent and that said Letters Patent is hereby corrected as shown below:

Column 9, Claim 24, line 21, please delete the words "a side" after the words "notch in".

Signed and Sealed this
Twelfth Day of June, 2012

David J. Kappos
*Director of the United States Patent and Trademark Office*